(12) United States Patent
Frisina

(10) Patent No.: US 7,084,034 B2
(45) Date of Patent: Aug. 1, 2006

(54) HIGH VOLTAGE MOS-GATED POWER DEVICE AND RELATED MANUFACTURING PROCESS

(75) Inventor: Ferruccio Frisina, S. Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 61 days.

(21) Appl. No.: 10/430,771

(22) Filed: May 6, 2003

(65) Prior Publication Data

US 2003/0201503 A1  Oct. 30, 2003

Related U.S. Application Data

(62) Division of application No. 09/457,122, filed on Dec. 7, 1999, now Pat. No. 6,586,798.

(30) Foreign Application Priority Data

Dec. 9, 1998  (EP) ................................ 98830737

(51) Int. Cl.
*H01L 21/336* (2006.01)
*H01L 21/425* (2006.01)
*H01L 21/332* (2006.01)

(52) U.S. Cl. .................... 438/273; 438/527; 438/137; 438/138

(58) Field of Classification Search ............ 438/237, 438/273, 137–138, 268, 527
See application file for complete search history.

(56) References Cited

U.S. PATENT DOCUMENTS

| 3,600,645 | A | * | 8/1971 | Berman | 257/772 |
| 4,072,975 | A | * | 2/1978 | Ishitani | 257/339 |
| 4,862,233 | A |   | 8/1989 | Matsushita et al. | |
| 5,047,813 | A |   | 9/1991 | Harada | |
| 5,070,382 | A | * | 12/1991 | Cambou | 257/502 |
| 5,132,235 | A | * | 7/1992 | Williams et al. | 438/294 |

(Continued)

FOREIGN PATENT DOCUMENTS

EP  0 397 014 A1  11/1990

OTHER PUBLICATIONS

European Search Report from European Patent Application 98830737, filed Dec. 9, 1998.

(Continued)

*Primary Examiner*—Michael Lebentritt
*Assistant Examiner*—Ron Pompey
(74) *Attorney, Agent, or Firm*—Lisa K. Jorgenson; James H. Morris; Wolf, Greenfield & Sacks, P.C.

(57) ABSTRACT

MOS-gated power device including a plurality of elementary functional units, each elementary functional unit including a body region of a first conductivity type formed in a semiconductor material layer of a second conductivity type. A plurality of doped regions of a first conductivity type is formed in the semiconductor material layer, each one of the doped regions being disposed under a respective body region and being separated from other doped regions by portions of the semiconductor material layer.

15 Claims, 4 Drawing Sheets

U.S. PATENT DOCUMENTS

| | | |
|---|---|---|
| 5,156,989 A | 10/1992 | Williams et al. |
| 5,216,275 A | 6/1993 | Chen |
| 5,349,225 A | 9/1994 | Redwine et al. |
| 5,438,215 A | 8/1995 | Tihanyi |
| 5,468,654 A | 11/1995 | Harada |
| 5,670,392 A * | 9/1997 | Ferla et al. ............ 438/138 |
| 5,923,065 A | 7/1999 | So et al. |
| 6,071,768 A | 6/2000 | Duvvury et al. |
| 6,093,948 A | 7/2000 | Zambrano et al. |
| 6,165,821 A * | 12/2000 | Boden et al. ............ 438/137 |
| 6,172,398 B1 | 1/2001 | Hshieh |
| 6,239,463 B1 | 5/2001 | Williams et al. |

OTHER PUBLICATIONS

Patent Abstracts of Japan vol. 012, No. 054 (E-583), Feb. 18, 1988 & JP 62 200766 A (Oki Electric Ind Co Ltd.).

* cited by examiner

HIGH VOLTAGE MOS-GATED POWER DEVICE AND RELATED MANUFACTURING PROCESS

This application is a division of prior application Ser. No. 09/457,122, filed Dec. 7, 1999, now U.S. Pat. No. 6,586,798 entitled HIGH VOLTAGE MOS-GATED POWER DEVICE AND RELATED MANUFACTURING PROCESS, which is incorporated herein by reference.

BACKGROUND OF THE INVENTION

1. Field of the Invention

The present invention relates to a high voltage MOS-gated power device, and to a related manufacturing process.

2. Discussion of the Related Art

MOS-gated power devices with breakdown voltages between 300 and 1000 V have a high output resistance (or "on" resistance) due mainly to the epitaxial drain layer resistance that is necessary for the high voltage applied, and depends on the doping concentration of the epitaxial layer itself.

On the other hand, if, in the attempt to increase the integration density it is desired to reduce the distance between the elementary functional units (cells or stripes) without increasing the output resistance of the MOS-gated power device, it is necessary to increase the doping concentration of the common drain layer. This, however, results in a reduction of the breakdown voltage of the MOS-gated power device.

In order to obtain MOS-gated power devices with a low output resistance and a high breakdown voltage, it is possible to produce power devices with drain layers comprising many sub-layers with different doping concentrations (MultiDrain devices, MDMOS).

Another known technique is described in U.S. Pat. No. 5,216,275 and in U.S. Pat. No. 5,438,215, wherein the common drain layers beneath the body regions of the elementary functional units are constituted by columns of the N conductivity type, alternated to body "pockets" of the P conductivity type. The above-mentioned structure is obtained by a manufacturing process comprising trench etching and filling steps, and such a process is very complex because the drain thickness is comprised between 20 and 100 μm whereas the width of the cells or stripes is about 5–10 μm.

In view of the state of the art described, it is an object of the present invention to provide a high voltage MOS-gated power device with a low output resistance.

SUMMARY OF THE INVENTION

According to the present invention, these and other objects are achieved in a MOS-gated power device comprising a plurality of elementary functional units, each elementary functional unit comprising a body region of a first conductivity type formed in a semiconductor material layer of a second conductivity type, a plurality of doped regions of a first conductivity type formed in said semiconductor material layer, each one of said doped regions being disposed under a respective body region and being separated from other doped regions by portions of said semiconductor material layer.

As a result of the present invention, and specifically due to the presence of the doped regions of a first conductivity type under the body regions of the elementary functional units, a MOS-gated power device is provided which, for a given breakdown voltage, has a common drain layer with a lower resistivity than that which would be necessary in a conventional MOS-gated power device with the same breakdown voltage.

Moreover, the doped regions under the body regions of the elementary functional units are able to withstand the high voltage in which the power device operates.

BRIEF DESCRIPTION OF THE DRAWINGS

These and other features of the present invention will be made more evident by the following detailed description of two particular embodiments, illustrated as non limiting examples in the annexed drawings, wherein.

DETAILED DESCRIPTION

Figure 1:
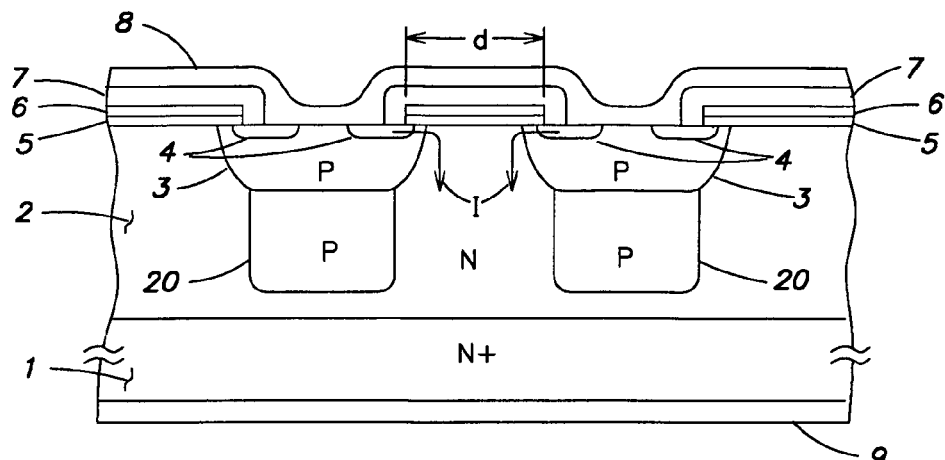
FIG. 1 is a cross-sectional view of a MOS-gated power device according to a first embodiment of the present invention.

With reference to the drawings, and specifically to FIG. 1, a MOS-gated power device chip according to the present invention comprises a heavily doped semiconductor substrate 1, over which a semiconductor layer 2 is formed, for example by means of an epitaxial growth. In the example shown, referring to the case of an N channel power MOSFET, both the substrate 1 and the epitaxial layer 2 are of the N conductivity type; differently, in a P channel power MOSFET both the substrate 1 and the epitaxial layer 2 would be of the P conductivity type.

The epitaxial layer 2 forms a common drain layer for elementary functional units of the MOS-gated power device. Each elementary functional unit comprises a body region 3 of the P conductivity type (or, more generally, of the opposite conductivity type of the epitaxial layer 2). The body regions 3 can have a polygonal layout (e.g. square or hexagonal), as in the case of "cellular" MOS-gated power devices, or alternatively they can be represented by elongated stripes (in which case FIG. 1 shows a cross-section in a direction transverse to the elongated stripes). Inside each body region 3, heavily doped source regions 4 of the N conductivity type (i.e. of the same conductivity type as the epitaxial layer 2) are provided.

The top surface of the epitaxial layer 2 is covered by an insulated gate layer comprising a thin gate oxide layer 5 and a polysilicon layer 6. Openings are provided in the insulated gate layer over each body region 3. The insulated gate layer is covered by an insulating material layer 7 in which contact windows are provided over each body region 3 to allow a source metal layer 8 to contact the source regions 4 and the body regions 3. A drain metal layer 9 is also provided on the bottom surface of the substrate 1.

In the epitaxial layer 2, beneath each body region 3, a region 20 of the opposite conductivity type as and having a higher resistivity than the epitaxial layer 2 is provided which extends downwardly substantially for the whole thickness of the epitaxial layer 2, to the substrate 1. Although region 20 is illustrated as extending through the whole thickness of the epitaxial layer 2, one skilled in the art will appreciate that region 20 may extend only partially through epitaxial layer 2.

As a result of the presence of the regions 20 beneath the body regions 3, it is possible to reduce the resistivity of the epitaxial layer 2 without decreasing the breakdown voltage of the MOS-gated power device, because the breakdown voltage of the MOS-gated power device depends on the resistivity and on the thickness of the portions of the common drain layer beneath the body regions, not on the portions of the common drain layer between the body regions. In other words, the presence of the doped regions 20 under the body regions 3 allows achievement of the desired breakdown voltage even with an epitaxial layer having a lower resistivity than that necessary with conventional devices.

As a consequence of the decreased resistivity of the epitaxial layer 2, the output resistance Ron of the MOS-gated power device is reduced, because the current flux I coming from the source regions and flowing towards the substrate 1 encounters a lower resistance.

Also, it is possible to reduce the distance d (FIG. 1) between adjacent elementary functional units without the drawback of an increase of the output resistance of the MOS-gated power device.

Figure 2:
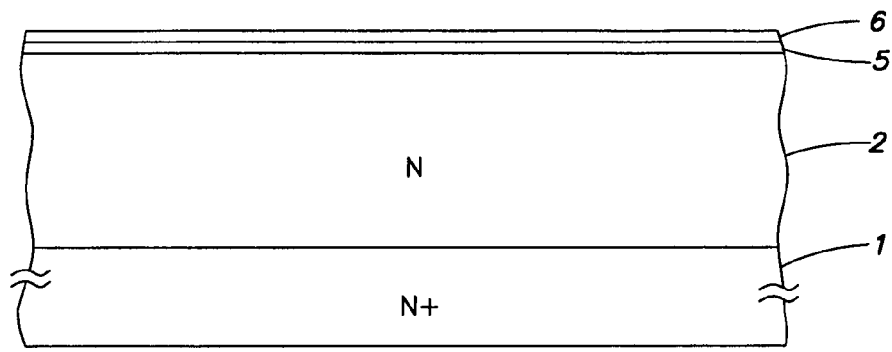
FIGS. 2 to 6 are cross-sectional views similar to FIG. 1 showing intermediate steps of a manufacturing process according to the first embodiment of the present invention.

A manufacturing process according to the invention will now be described with reference to FIGS. 2–6. Referring to FIG. 2, the semiconductor layer 2 is epitaxially grown over the heavily doped substrate 1, the thickness of the epitaxial layer 2 depending on the voltage class of the MOS-gated power device to be fabricated; for example, for devices operating in the voltage range 30–100 V the epitaxial layer 2 can have a thickness of about 2 or 7 μm. However, while in conventional devices the resistivity of the epitaxial layer is determined on the basis of the desired breakdown voltage of the MOS-gated power device (for example 1 ohm×cm for a breakdown voltage of 60 V), in the present invention the epitaxial layer 2 has a resistivity which is lower than that necessary to achieve the same desired breakdown voltage (for example 0.6 ohm×cm).

Over the surface of the epitaxial layer 2 a thin oxide layer 5 is formed, for example by means of a thermal growth. A polysilicon layer 6 is then deposited over the oxide layer 5.

Figure 3:
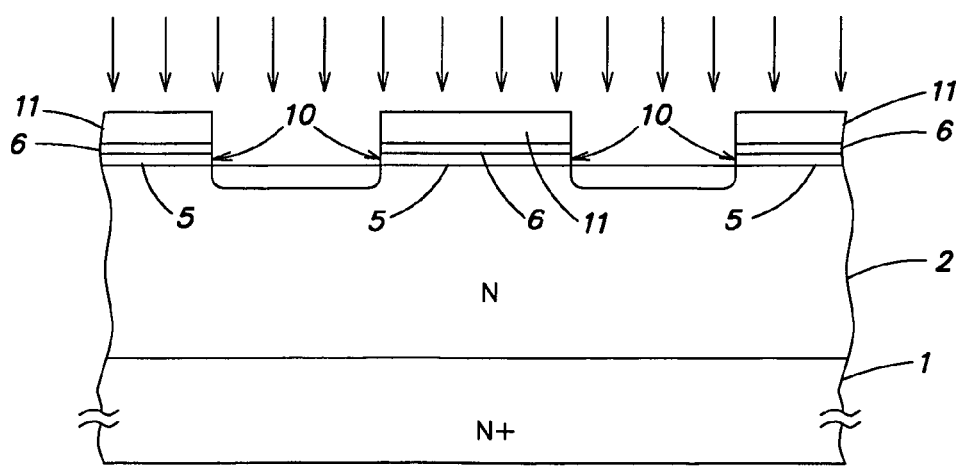

As illustrated in FIG. 3, the polysilicon layer 6 and the oxide layer 5 are then selectively removed from the surface of the epitaxial layer 2 to form openings 10. This step involves depositing a photoresist layer 11, selectively exposing the photoresist layer 11 to a light source by means of a mask carrying the pattern of the openings 10, selectively removing the photoresist layer 11, and etching the polysilicon and oxide layers 5, 6 where they are not covered by the photoresist layer 11. The openings 10 can have a polygonal layout (for example square or hexagonal, i.e., cellular layout), or they can be elongated stripes.

Figure 4:
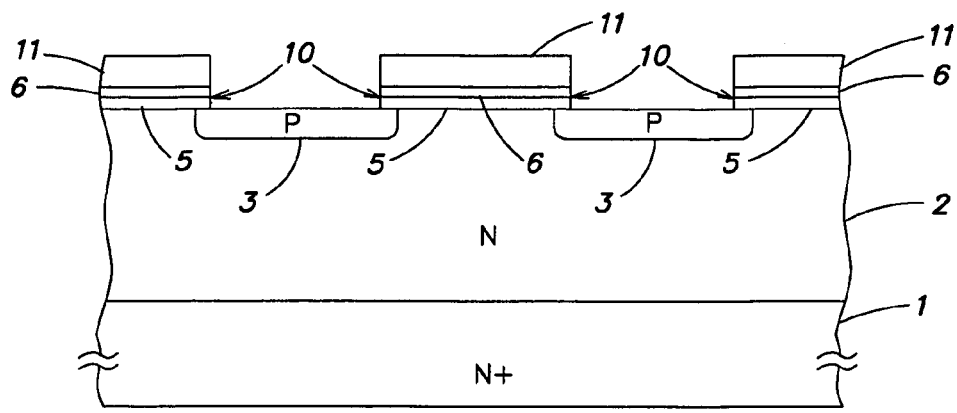

Doped regions which will form the body regions of the elementary functional units of the MOS-gated power device, are then formed. To this purpose, a P type dopant such as boron is implanted, using the polysilicon and oxide layers 5, 6 (and if necessary also the photoresist layer 11) as a mask, in a dose ranging from $5\times10^{13}$ to $5\times10^{14}$ atoms/cm², with an implantation energy in the range 80–200 keV (FIG. 3). As illustrated in FIG. 4, a subsequent thermal diffusion of the dopants forms the body regions 3 with a surface concentration in the channel region of approximately $10^{17}$ atoms/cm³, which is a concentration necessary to achieve the desired threshold voltage of the MOS-gated power device.

Alternatively, the body regions 3 can be formed by means of two distinct implants of boron in different doses and at different energies, still using the polysilicon and oxide layers 5, 6 as a mask.

For example, the first implant can involve a dose of a P type dopant in the range $10^{13}$–$10^{14}$ atoms/cm² with an energy of approximately 80 keV and is used to control the dopant concentration at the surface of the body regions, especially in the channel regions, which sets the desired threshold voltage of the MOS-gated power device. A subsequent thermal diffusion process at a temperature in the range 1050–1100° C. for 0.5 to 2 hours determines the lateral diffusion of the dopant introduced with the first implant, to form the channel regions of the body regions extending under the gate oxide layer. The second implant can involve, for example, a dose of P type dopant in the range $10^{14}$–$10^{15}$ atoms/cm² with an energy comprised between 100 keV and 300 keV, such that the peak concentration of the dopants can be located at a prescribed depth, namely under the source regions which will be formed in a later step. The dopants introduced with the second implant form the heavily doped deep body portions of the body regions, reducing the resistivity of the body regions under the source regions.

Figure 5:
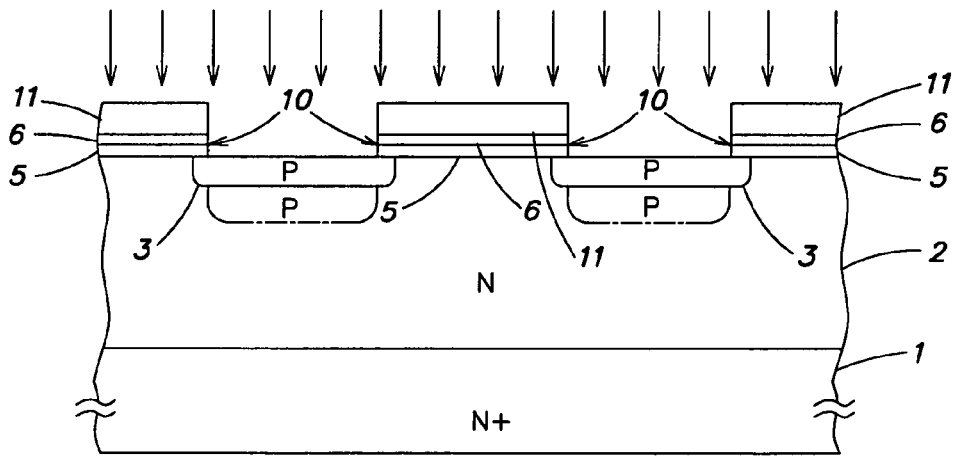

As illustrated in FIG. 5, a dopant of the P conductivity type, preferably one having a high diffusivity such as aluminium, is implanted into the epitaxial layer 2 using the polysilicon and oxide layers 5, 6 (and if necessary the photoresist layer 11) as a mask. The implant dose is suitable to invert the conductivity type of the epitaxial layer in a P conductivity type one. The implantation energy (ranging from 700 keV to 1 MeV) is such as to locate the peak concentration of the dopant as close as possible to a body-drain junction (1.5–2 μm from the surface of the epitaxial layer 2).

Figure 6:
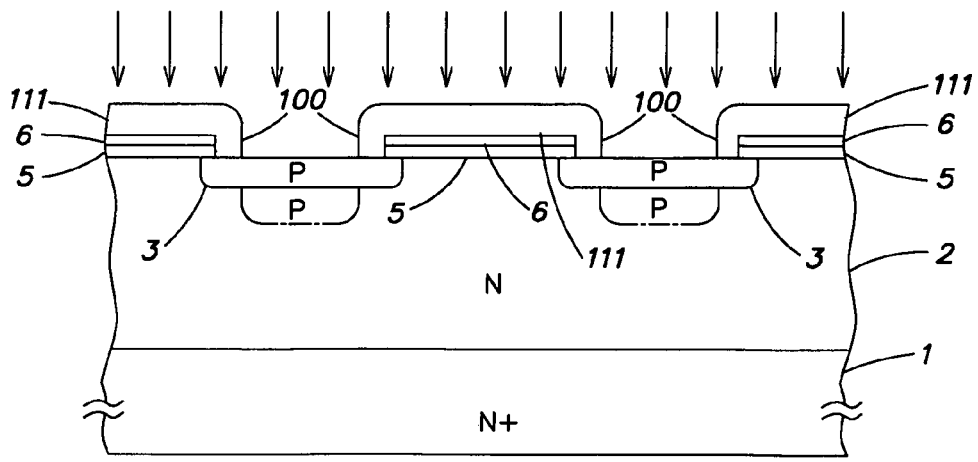

Alternatively, as shown in FIG. 6, the implant mask for the high-diffusivity dopant could be formed by another photoresist layer 111 with smaller openings 100 than the openings 10 in the polysilicon and oxide layers 5, 6. Subsequently, a high dose of a N type dopant (such as arsenic or phosphorus) is then selectively implanted into the body regions 3 to form the source regions 4. The N type dopant is then made to diffuse by means of a thermal process. During such thermal process, the source dopant diffuses for a depth of about 0.4–0.5 μm in the case of arsenic, or about 0.6–0.7 μm in the case of phosphorus. During the same thermal process, the high-diffusivity P type dopant diffuses for a depth of about 1.5–2 μm, distributing in a controlled manner under all the body regions 3 substantially to the substrate 1, inverting the doping conductivity type of the epitaxial layer 2 under the body regions 3.

The following process steps involve forming a layer of insulating material 7 over the whole surface of the chip, opening contact windows in the insulating layer 7 over the body regions 3, and forming a source metal layer 8 and a drain metal layer 9.

If the budget of the thermal diffusion process used to diffuse the source dopant is not sufficient to completely diffuse the high diffusivity dopant, for example in high voltage devices with a thick epitaxial layer, it is possible to modify the thermal diffusion process of the source dopant, or to invert the described sequence of steps, for example implanting the high-diffusivity dopant before the step of formation of the body regions 3, to exploit the thermal diffusion process of the body regions.

FIGS. 7 to 13 show, in cross-sectional views similar to that of FIG. 1, the main steps of a second embodiment of a manufacturing process according to the present invention. Such embodiment is particularly suitable for the manufacturing of high voltage devices, capable of sustaining voltages of 200 to 1000 V or more. A unique aspect of these devices is that, in order to sustain such voltage values, the thickness of the drain layer has to be in the range 15 to 80 µm or even more. The size of the elementary functional units, be they cells or stripes, varies instead among 5 to 15 µm.

Clearly, in view of the substantial thickness of the drain layer, the manufacturing processes previously described, providing for a single implantation from the front of the device, could prove not suitable for forming P regions extending sufficiently in the drain layer under the body regions.

The second embodiment which will be now described allows to overcome the above problem.

Figure 7:
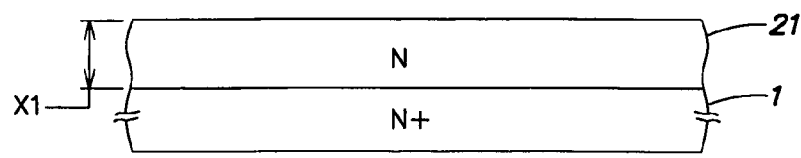
FIGS. 7 to 12 are cross-sectional views similar to that of FIG. 1 of a second embodiment of a manufacturing process according to the invention, particularly suitable for the manufacturing of high-voltage MOS-gated power devices.

Referring to FIG. 7, a first epitaxial layer 21 of the N conductivity type is formed over the N+ substrate 1. Epitaxial layer 21 has a thickness X1 approximately equal to the size of the elementary functional units, be they cells or stripes, i.e., for example, 5 to 10 µm. The thickness X1 of epitaxial layer 21 is much lower, e.g. one third or less, than the overall thickness of the drain layer of the final device. The doping level of epitaxial layer 21 is higher than that required for assuring that the device keeps the desired high voltage. A doping level of $5 \times 10^{14}$–$3 \times 10^{15}$ atoms/cm$^3$ (5–10 ohm/cm) is suitable.

Figure 8:
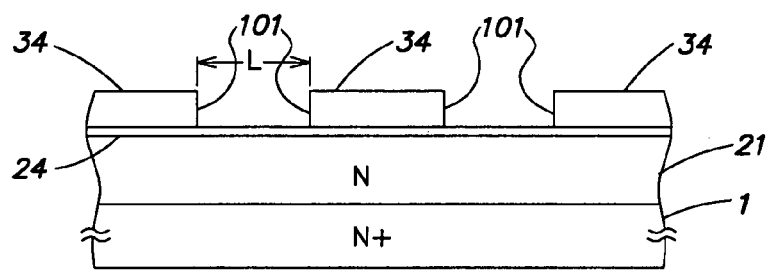

Referring to FIG. 8, an oxide layer 24 with a thickness of about 200–1000 Å is then formed over the top surface of epitaxial layer 21. A photoresist layer 34 is then formed over the oxide layer 24 and is selectively removed from the areas wherein the elementary cells or stripes will be formed, i.e. in openings 101. The size L of the openings 101 in the photoresist layer 34 is slightly lower than the size of the elementary cells or stripes. The oxide layer 24 has a thin thickness that does not prevent the subsequent ion implantation and protects the top surface of epitaxial layer 21 during the removal of the photoresist layer 34.

Figure 9:
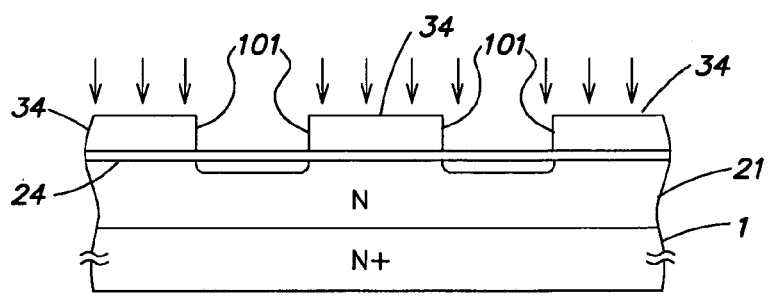

Referring to FIG. 9, a P type dopant such as boron or aluminum is then selectively implanted into the epitaxial layer 21, using the photoresist layer 34 as a mask. A suitable implantation energy is in the range 100 to 900 keV. The implant dose is chosen in such a way that, after the thermal diffusion processes that will follow, the implanted P type dopant inverts the N type doping of the epitaxial layer 21. A suitable dose ranges from $5 \times 10^{11}$ to $1 \times 10^{13}$ atoms/cm$^2$.

Figure 10:
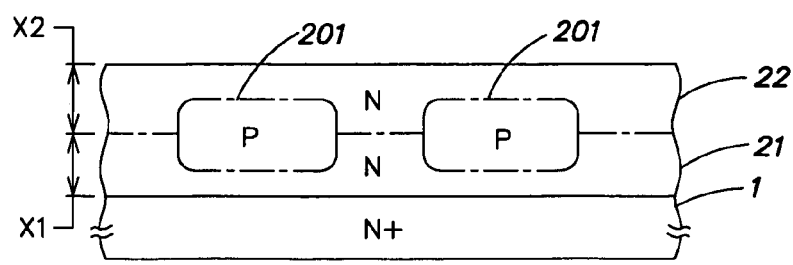

Referring to FIG. 10, the photoresist layer 34 and the oxide layer 24 are then completely removed and a second epitaxial layer 22 of the N conductivity type is formed over the first epitaxial layer 21. Preferably, the thickness X2 of the second epitaxial layer 22 and its dopant concentration are respectively similar to the thickness X1 and dopant concentration of the first epitaxial layer 21. During the growth of the second epitaxial layer 22, that as known involves a thermal process, the P type dopant previously implanted diffuses into the first and second epitaxial layers 21, 22, thus forming P regions 201 having dopant concentration approximately lower than or equal to $10^{15}$ atoms/cm$^3$.

Figure 11:
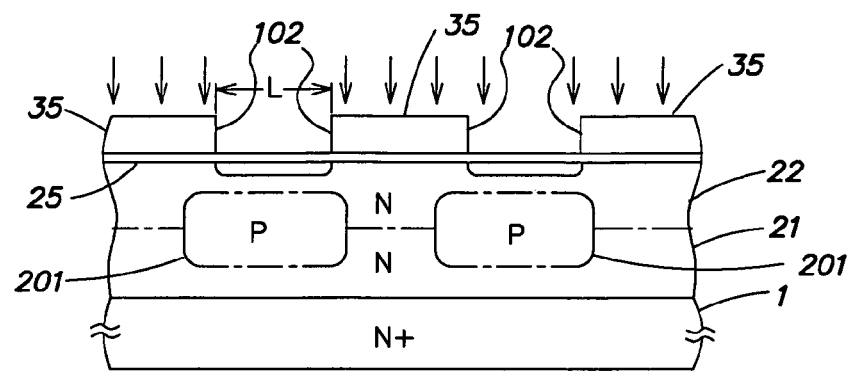

Referring to FIG. 11, another oxide layer 25 and photoresist layer 35 are then formed over the second epitaxial layer 22. The photoresist layer 35 is then selectively removed using the same layout previously used to remove photoresist layer 34, and openings 102 are formed. A P type dopant such as boron or aluminum is then selectively implanted through the openings 102 using the photoresist layer 35 as a mask, as in the step depicted in FIG. 9. The implantation dose and energy are chosen in the same way as before.

Figure 12:
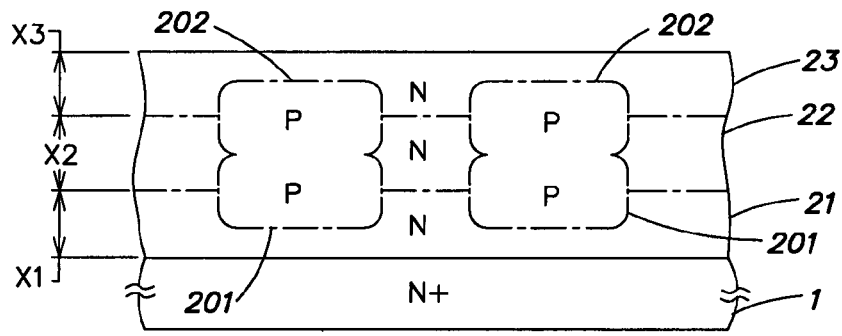

Referring to FIG. 12, the photoresist layer 35 and the oxide layer 25 are then completely removed, and a third epitaxial layer 23 of the N conductivity type is formed over the second epitaxial layer 22. Preferably, the thickness X3 and the dopant concentration of the third epitaxial layer 23 are respectively similar to the thickness X2 and the dopant concentration of the second epitaxial layer 22. During the growth of the third epitaxial layer 23, that involves a thermal process, the P type dopant previously implanted diffuses into the second and third epitaxial layers 22, 23, to form P regions 202, and also regions 202 further diffuse vertically. In this way, P regions 202 and P regions 201 merge, forming columns of stacked P regions 202, 201. The dopant concentration of P regions 202 and 201, together with their geometrical disposition and size, is suitable to sustain the desired high voltage. In fact the total charge amount in the P regions 202, 201 and in the N drain regions therebetween must to be the same, and so there is a correlation between the geometrical size of the above-mentioned regions and their concentration.

Figure 13:
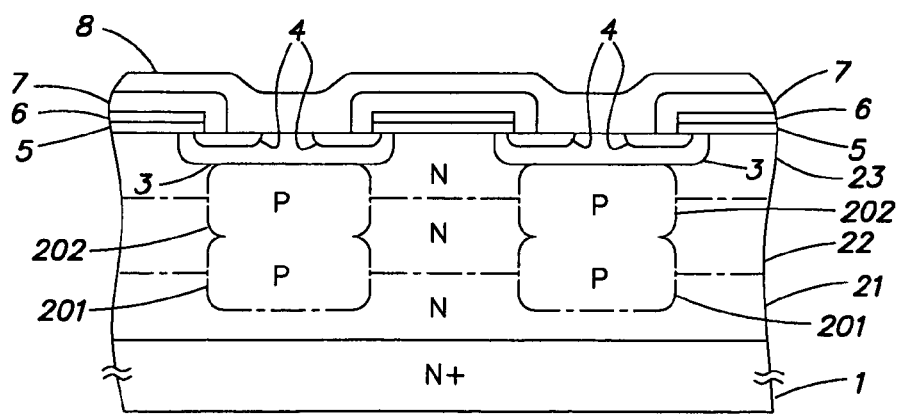
FIG. 13 shows in cross-section the high voltage MOS-gated power device obtained by the process of FIGS. 7 to 12.

The subsequent steps are similar to those of the processes according to the first embodiment described. Clearly, the body regions of the elementary functional units will have to be formed in the third epitaxial layer 23 over the stacked P regions 201 and 202, as shown in FIG. 13. The stacked P regions 201 and 202 are merged and form an unique P "column" under the body regions 3.

Differently, it is possible to grow epitaxial layers with higher thickness, possibly reducing the overall number of the same epitaxial layers, in order to obtain stacked P regions, not merged to each other to form an unique P column. These not merged stacked P regions are, however, electrically connected due to the electric field applied during the device operation.

As an alternative, instead of performing into each of the epitaxial layers 21 and 22 a single implant, several implants can be performed in succession into each of the epitaxial layers 21 and 22. Each implant of the succession is performed with a respective energy, so as to locate the peak dopant concentration at a respective depth. The dose of these implants ranges form $5 \times 10^{12}$ to $5 \times 10^{13}$ atoms/cm$^2$, and the energies range from 100 keV to 900 keV or more. For example, where the implanted dopant is boron, three implants at 300 keV, 600 keV and 900 keV can be performed, so as to have peak dopant concentrations located at a depth of 0.7 µm, 1.2 µm and 1.7 µm, respectively.

In this way, "box" shaped concentration profiles are obtained.

Clearly, the number of stacked epitaxial layers can be different from three. The number of epitaxial layers to be formed depends on the overall thickness of the drain layer of the final device, i.e., on the voltage to be sustained by the power device.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for the manufacturing of a MOS-gated power device, comprising the steps of:
   a) forming a semiconductor material layer of a first conductivity type and with a first resistivity value over a heavily doped semiconductor substrate of the first conductivity type;
   b) forming an insulated gate layer over said semiconductor material layer;
   c) selectively removing said insulated gate layer to open windows over selected portions of a surface of said semiconductor material layer;
   d) forming body regions of a second conductivity type and with a second resistivity value in said semiconductor material layer using the remaining portions of said insulated gate layer as a mask;
   e) forming source regions of the first conductivity type in said body regions,
   said process providing for forming doped regions of the second conductivity type in said semiconductor material layer, each one of said doped regions being located under a respective body region of the final power device and extending in said semiconductor material layer, wherein said doped regions of the second conductivity type under said body regions are formed implanting into said semiconductor material layer of the first conductivity type a dopant of the second conductivity type in a dose suitable to invert the first conductivity type of said semiconductor material layer;
   wherein said dopant of the second conductivity type implanted to form said doped regions under said body regions is a dopant having high diffusivity in said semiconductor material layer; and
   wherein the step of formation of the source regions comprising a selective implant of a dopant of the first conductivity type and a subsequent thermal diffusion of the implanted dopant, wherein said high diffusivity dopant implanted to form said doped regions under said body regions is implanted before the formation of said source regions, and is thermally diffused in said semiconductor material layer substantially down to said semiconductor substrate during the thermal diffusion of the dopant forming said source regions.

2. Process according to claim 1, wherein said dopant of the second conductivity type is implanted in a dose suitable to form lightly doped regions.

3. Process according to claim 1, wherein said dopant of the second conductivity type is introduced into said semiconductor material layer in a dose suitable to make the second resistivity value higher than said first resistivity value.

4. Process according to claim 1, the step of formation of said body regions comprising an implant of a dopant of the second conductivity type through said windows in the insulated gate layer and a subsequent thermal diffusion of the implanted dopant, wherein said high diffusivity dopant implanted to form said doped regions under said body regions is implanted before the formation of said body regions, and is thermally diffused in said semiconductor material layer substantially down to said semiconductor substrate during the thermal diffusion of the dopant forming said body regions.

5. Process according to claim 1, wherein said high diffusivity dopant is implanted through said windows in said insulated gate layer.

6. Process according to claim 1, wherein said high diffusivity dopant is implanted into a surface area of said semiconductor material layer internal to said windows in said insulated gate layer.

7. Process according to claim 1, wherein the steps of forming said semiconductor material layer and forming said doped regions comprise sub-steps of forming a first semiconductor material sub-layer, selectively implanting a dopant of the second conductivity type in said first semiconductor material sub-layer, forming a second semiconductor material sub-layer over said first semiconductor material sub-layer, thermally diffusing said dopant of said first semiconductor material sub-layer in said second semiconductor material sub-layer in order to form doped sub-regions inside said semiconductor material layer constituted by said semiconductor material sub-layers.

8. Process according to claim 7, further comprising repeating, at least one time, said sub-steps of forming said semiconductor material sub-layers so that said semiconductor material layer is constituted by the superimposition of said semiconductor material sub-layers, and the doped regions are constituted by the superimposition and merging of said doped sub-regions.

9. Process according to claim 7, further comprising repeating, at least one time, said sub-steps of forming said semiconductor material sub-layers so that said semiconductor material layer is constituted by the superimposition of said semiconductor material sub-layers, and the doped regions are constituted by said doped sub-regions that are not vertically merged to each other.

10. Process according to claim 7, wherein said first and second semiconductor material sub-layers have approximately similar thickness.

11. Process according to claim 7, wherein said first and second semiconductor material sub-layers have similar dopant concentrations of approximately $5\times10^{14}$–$3\times10^{15}$ atoms/cm$^3$, corresponding to a resistivity of 5–10 ohms/cm.

12. Process according to claim 1, wherein said first conductivity type is the N type, and said second conductivity type is the P type.

13. Process according to claim 12, wherein said high diffusivity dopant is aluminum.

14. Process according to claim 13, wherein said dopant is implanted with an energy ranging from 100 to 900 keV and in a dose of approximately $5\times10^{11}$ to $1\times10^{13}$ atoms/cm$^2$.

15. Process according to claim 1, wherein said first conductivity type is the P type, and said second conductivity type is the N type.

* * * * *